United States Patent [19]
Cross et al.

[11] 4,155,056
[45] May 15, 1979

[54] CASCADED GRATING RESONATOR FILTERS WITH EXTERNAL INPUT-OUTPUT COUPLERS

[75] Inventors: Peter S. Cross, Middletown; Ronald V. Schmidt, Matawan, both of N.J.

[73] Assignee: Bell Telephone Laboratories, Incorporated, Murray Hill, N.J.

[21] Appl. No.: 827,576

[22] Filed: Aug. 25, 1977

[51] Int. Cl.² .................. H03H 9/26; H03H 9/32; G02B 5/124; G02B 5/26
[52] U.S. Cl. .................. 333/195; 350/96.12; 350/162 R
[58] Field of Search .................. 333/72, 30 R, 71, 10; 350/96.10, 96.11, 96.12, 96.15, 162 R; 310/313

[56] References Cited

U.S. PATENT DOCUMENTS

| | | | |
|---|---|---|---|
| 3,578,845 | 5/1971 | Brooks et al. | 350/162 R |
| 3,836,876 | 9/1974 | Marshall et al. | 333/72 X |
| 3,882,430 | 5/1975 | Maerfeld | 333/72 X |
| 3,883,831 | 5/1975 | Williamson et al. | 333/30 R |
| 3,965,446 | 6/1976 | Craven et al. | 333/72 |
| 4,013,983 | 3/1977 | Hartemann | 333/30 R X |
| 4,055,820 | 10/1977 | Solie | 333/30 R |

OTHER PUBLICATIONS

Cross et al.–"Sidelobe Suppression in Corrugated Waveguide Filters" in Optics Letters, vol. 1, No. 1, Jul. 1977; pp. 43-45.
Haus et al.–"Transmission Response of Cascaded Gratings" in IEEE Trans. on Sonics and Ultrasonics, vol. Su-24, No. 2; pp. 94-101.
Marcatili–"Dielectric Rectangular Waveguide and Directional Coupler for Integrated Optics" in Bell System Technical Journal, Sep. 1969, pp. 2071-2102.

*Primary Examiner*—Alfred E. Smith
*Assistant Examiner*—Marvin Nussbaum
*Attorney, Agent, or Firm*—Daniel D. Dubosky

[57] ABSTRACT

Acoustical and optical surface wave filters are described wherein the filter characteristic near resonance is provided by cascaded grating resonators. The out-of-band suppression for these resonators is provided by a track changing element that includes a four-port directional coupler having one port connected to receive input energy and a fourth port connected to couple energy into the cascaded grating resonators. Tapered and chirped reflection gratings are positioned so as to selectively reflect energy present at the second and third ports of the directional coupler. In a surface acoustic wave embodiment of the invention, the directional coupler is provided by a multistrip coupler. In an optical embodiment, the directional coupler function is provided by waveguiding structures that are brought sufficiently close to induce 3 dB coupling.

11 Claims, 6 Drawing Figures

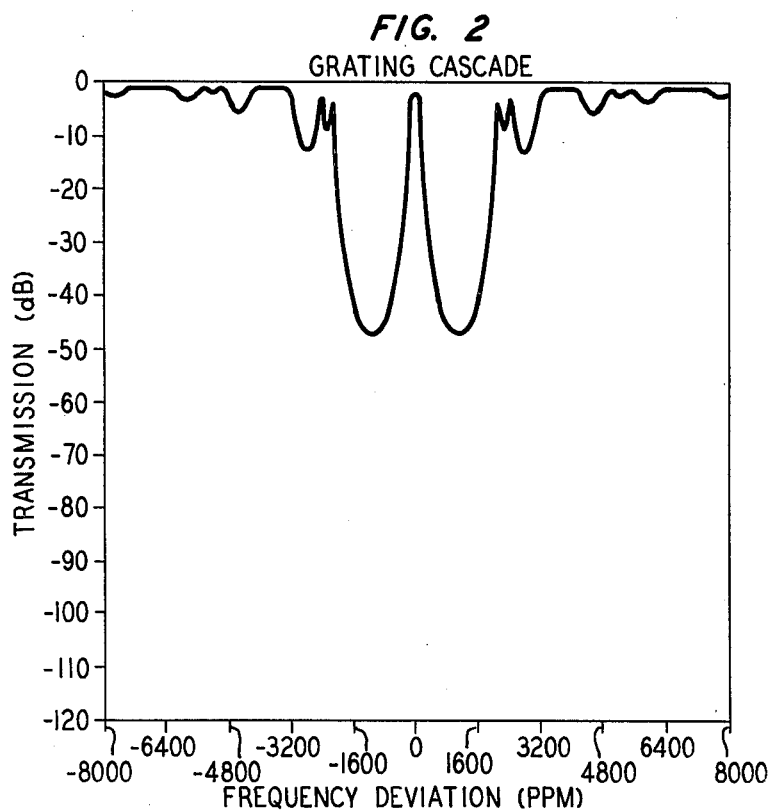
FIG. 2 GRATING CASCADE
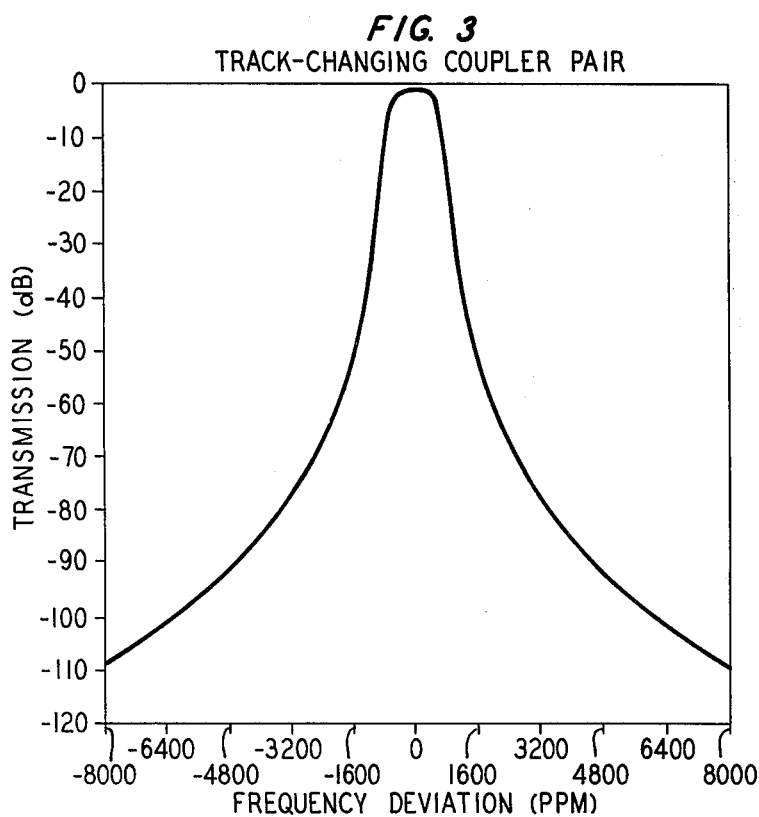
FIG. 3 TRACK-CHANGING COUPLER PAIR

COMPOSITE FILTER RESPONSE

CASCADED GRATING RESONATOR FILTERS WITH EXTERNAL INPUT-OUTPUT COUPLERS

BACKGROUND OF THE INVENTION

This invention relates to surface wave devices and more particularly to surface wave filters that use cascaded grating resonators to provide a bandpass characteristic.

It has been recognized in the art that useful bandpass filter characteristics can be provided by cascading a plurality of grating resonators. See, for example, the article entitled "Transmission Response of Cascaded Gratings", by H. A. Haus and R. V. Schmidt, *IEEE Transactions on Sonics and Ultrasonics*, March 1977, pages 94–101. Cascaded grating resonators that are collinearly coupled provide an especially desirable transmission bandpass characteristic in that the characteristic is very flat in the passband and the characteristic has steeper sides than the transmission bandpass of a single resonator. With the resonators collinearly coupled, the excitation source may be placed outside of the cavity thereby eliminating the disturbance that would normally be introduced with an excitation source in the cavity. Unfortunately, this type of structure has no out-of-band rejection for each frequency corresponding to a normalized frequency ($|\delta/\kappa|$) greater than one, where $\delta$ is a measure of the frequency deviation from the Bragg frequency ($\beta^2 - \beta_0^2/2\beta_0$) and $\kappa$ is the coupling coefficient. In fact, for these frequencies that are essentially out-of-band with respect to the desired filter characteristic, the transmission is very close to unity.

The requirement for out-of-band suppression of the transmission characteristic for cascaded grating resonators is recognized in U.S. Pat. No. 4,013,983 to P. Hartemann, issued Mar. 22, 1977. FIG. 5 of the Hartemann patent discloses a proposed solution to this problem in that it discloses a track-changing element to provide the out-of-band suppression. Specifically, the Hartemann patent discloses a right angle reflection grating that couples the input energy from a transducer into a grating resonator. As pointed out in the patent, only the rays that are situated in the stop band of the right angle reflection grating are transmitted to the cascaded grating resonators. At this point in the art, it is virtually impossible to design a right angle reflection grating of the type shown in FIG. 5 of the Hartemann patent to provide the high degree of reflection necessary to introduce low loss within the passband of the resonator, and to provide the degree of suppression necessary to remove the sidelobes normally present in this type of cascaded grating resonator filter.

SUMMARY OF THE INVENTION

It is a primary object of the present invention to provide the out-of-band suppression required by cascaded grating resonators through use of a track-changing element that is highly predictable in terms of its low loss in-band performance and out-of-band suppression. This object and others are achieved in accordance with the present invention wherein the input energy is coupled to a cascaded grating resonator through a track-changing element that includes normal incidence, tapered and chirped reflection gratings. As pointed out hereinafter, these gratings can be designed to provide a high degree of in-band reflectivity with a high degree of suppression of the out-of-band reflectivity. The input energy is coupled to the normal incidence grating through a fourport directional coupler. In the embodiment utilizing surface acoustic waves, the directional coupler function is provided by a multistrip coupler positioned so as to receive the input energy at one of its ports and to couple energy from its fourth port into the cascaded grating resonators. In the embodiment which uses optical energy, strip waveguides are brought sufficiently close together so as to induce 3 dB coupling and thereby provide the directional coupler function.

BRIEF DESCRIPTION OF THE DRAWINGS

The invention will be more readily understood after reading the detailed description taken in conjunction with the drawing wherein:

FIGS. 2, 3 and 4 are transmission spectra

DETAILED DESCRIPTION

Figure 1:
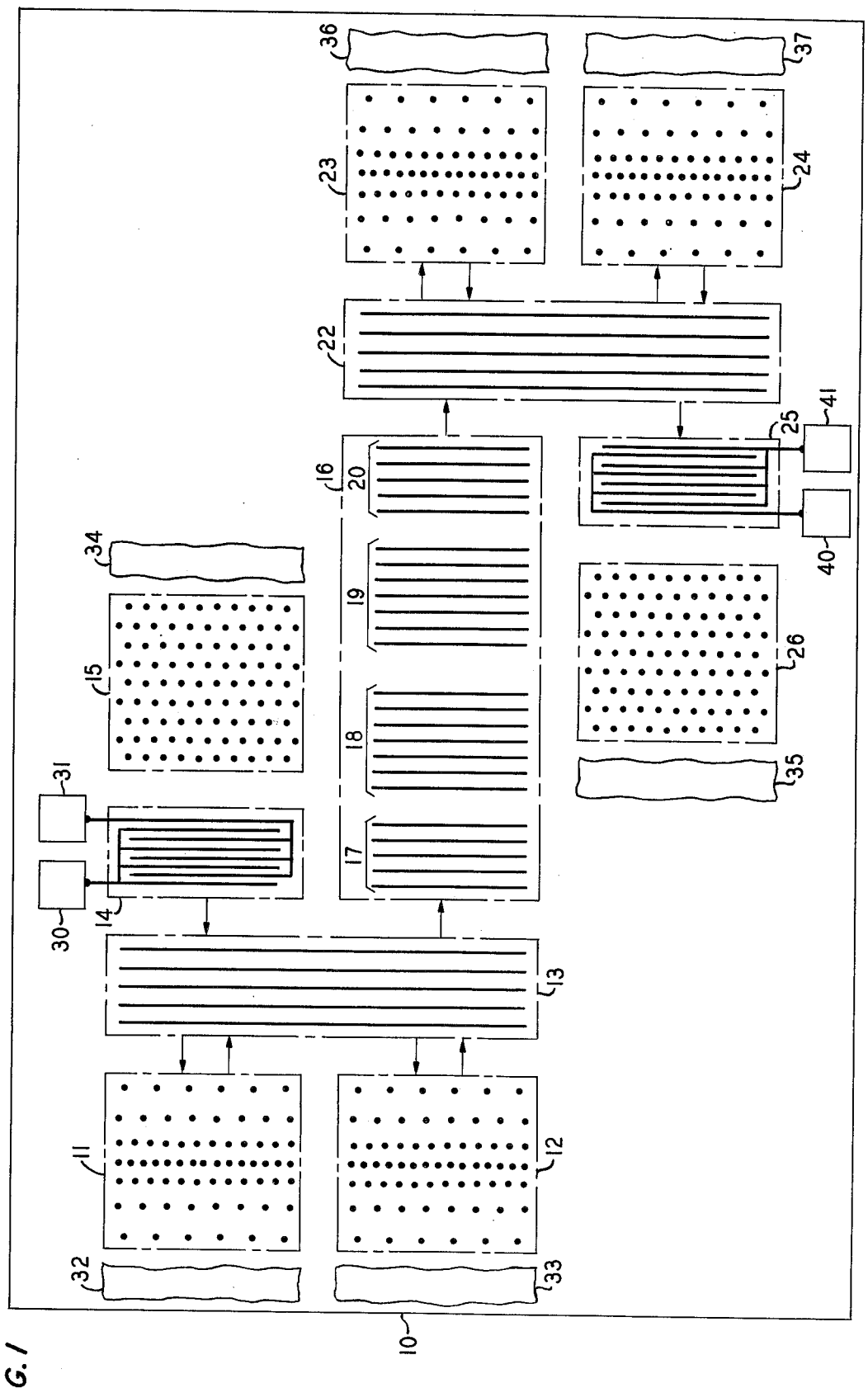
FIG. 1 is an illustration of an acoustic cascaded grating resonator having input and output couplers constructed in accordance with the present invention.

A surface acoustic wave filter constructed in accordance with the present invention is illustrated in FIG. 1. The filter is constructed by depositing or diffusing elements into a Y-cut Z-propagating substrate 10 of lithium niobate (YZ-LiNbO$_3$). Central to this substrate 10 shown in FIG. 1 is a cascaded grating resonator filter shown enclosed within dotted box 16. This dotted enclosure 16 like all other dotted enclosures illustrated in FIG. 1 are shown simply to segregate or separate the various functional elements deposited on substrate 10. An actual device would visually exhibit only the elements that can be seen under high powered magnification.

Cascaded grating resonator filter 16 is formed on substrate 10 by diffusing titanium in a predetermined pattern into the surface of the LiNbO$_3$ substrate. By using titanium diffused elements, rather than aluminum strips as in the other elements to be described hereinafter, a high Q filter characteristic with low loss in the passband is achieved for filter 16. The pattern of the deposited elements is illustrated by the line structure shown in FIG. 1. As indicated in FIG. 1, filter 16 is actually composed of series of cascaded uniform reflection gratings 17 through 20. All reflection gratings 17 through 20 are separated by a distance equivalent to one-quarter wavelength at the resonant frequency of the grating. This entire filter structure is designed in accordance with the equations set forth in the above-identified article entitled "Transmission Response of Cascaded Gratings", by H. A. Haus and R. V. Schmidt.

The cascaded grating resonator filter 16, if present by itself, would provide a transmission characteristic of the type illustrated in FIG. 2. As indicated in FIG. 2, a narrow bandpass response with low loss at the center frequency and fairly steep slopes is available in a frequency region close to the resonant frequency of the grating resonators. For the filter that was actually constructed having a resonant frequency of about 150 MHz, the loss provided along the steep slopes of the characteristic ceases to increase at a point approximately 1200 parts per million away from the resonant frequency. The loss beyond these frequencies decreases to a point where a transmission of close to unity is achieved at frequencies removed from the center frequency. This characteristic illustrated in FIG. 2 is typical of cascaded grating resonators. To provide an effective narrow bandpass filter function, it would be highly desirable to have a transmission characteristic identical to the cascaded grating resonators at frequencies close to the center frequency, but this characteristic should continue to increase in loss for frequencies that are further removed from the center frequencies.

This problem associated with the transmission characteristic of cascaded grating resonators has been recognized by those skilled in the art. See, for example, U.S. Pat. No. 4,013,983 to P. Hartemann issued Mar. 22, 1977. In the Hartemann patent rejection of the out-of-band energy is achieved by deflecting the energy from an input transducer by means of a right-angle reflection grating. As pointed out in the patent, only the rays of energy that are situated in the stop band of the reflection grating will be coupled to the input of the filter structure using the cascaded grating resonators.

To achieve rejection of the out-of-band energy in the present embodiment illustrated in FIG. 1, the energy coupled to the input of the cascaded grating resonator filter 16 is first coupled through a track-changing element using the elements designed by the numerals 11, 12 and 13 in FIG. 1. As will be described hereinafter, these elements serve not only to couple the energy that is present in a broad band that encompasses the sharp resonant structure of filter 16 through to the cascaded grating resonator, but also to provide the out-of-band rejection necessary to achieve a desirable filter characteristic. They do so in a manner that advantageously permits acoustical energy to always propagate in tracks that are parallel to each other. As a result, the track of propagation may be aligned with the preferred direction on the LiNbO$_3$ substrate.

In FIG. 1 the electrical signal to be operated upon by the surface acoustic wave device is connected to terminals 30 and 31 of a transducer 14. Transducer 14 is constructed in the conventional manner by depositing aluminum strips in a pattern of interleaved fingers of the form illustrated in FIG. 1. Transducer 14 utilizes the piezoelectric effect present in the LiNbO$_3$ substrate to transduce the electrical energy present at input terminals 30 and 31 into surface acoustic waves that propagate in the two directions that are perpendicular to the finger elements of the transducer. Accordingly, 50 percent of the energy is propagated toward a reflection grating 15.

As illustrated in FIG. 1, grating 15 is constructed by depositing aluminum dots on the surface of the LiNbO$_3$ substrate 10. In the case of grating 15, these dots are deposited in rows with equal spacing between each of the rows and with equal spacing between the dots in each row. As will be apparent to those skilled in the art, this type of dot structure provides an unchirped and untapered grating. A sufficient number of rows of dots are deposited on the substrate such that substantially all of the acoustic energy present to this grating by transducer 14 is reflected back toward the transducer. The acoustic energy which manages to pass through grating 15 is attenuated in an absorber 34. Accordingly, transducer 14 and reflection grating 15 provide a unidirectional source of acoustical energy in the surface of substrate 10. This acoustical energy from the unidirectional source propagates in a direction illustrated by the unnumbered arrow in FIG. 1 directed away from transducer 14. As will be apparent to those skilled in the art, the unidirectional source provided by transducer 14 and reflection grating 15 may take several other forms. See for example, FIGS. 16 and 17 of U.S. Pat. No. 3,836,876 to F. G. Marshall et al issued Sept. 17, 1974, for two other patterns of elements that can provide a unidirectional source.

The surface acoustic wave energy from transducer 14 is coupled as indicated in FIG. 1 into one port of a fourport directional coupler 13. This coupler 13 in the present embodiment is acutally a multistrip coupler of the type described in the above-identified patent to F. G. Marshall et al, and is constructed by depositing a plurality of aluminum strips, each strip being parallel to the other as indicated in FIG. 1. The action of this multistrip coupler is such that the energy provided to it from the unidirectional source is divided and presented at second and third ports of the directional coupler 13. The energy present at the second and third ports is coupled to reflection gratings 11 and 12, respectively. These gratings are positioned such that the energy from the second and third ports of the directional coupler is normally incident to the elements of the gratings.

Gratings 11 and 12 are constructed by depositing aluminum dots on the surface of substrate 10 in a pattern wherein the number of dots per row decreases as the distance increases from the center of grating (that is, the grating coupling coefficient is tapered), and the spacing between the rows also changes as the distance increases from the center of the grating (that is, the grating period is chirped). The pattern of dots provides a chirped and tapered grating of the type illustrated in FIG. 1. These tapered and chirped gratings are essential elements in the present invention and therefore some additional discussion is warranted.

As is well known to those skilled in the art, a uniform grating, that is one with a constant number of dots per row and equal spacing between rows, can provide high peak reflectivity, but always associated with high peak reflectivity are high side lobe levels. In order to suppress these out-of-band side lobes the coupling coefficient $\kappa(z)$ is tapered in gratings 11 and 12 of this specific embodiment in accordance with the cosinusoidal function shown in FIG. 5 and given by the following equation:

$$\kappa(z) = \kappa_{max} \frac{[1 + \cos(2\pi z/L)]}{2} \qquad (1)$$
$$-L/2 \leq z \leq L/2$$

where $z=0$ at the center of the grating, L is equal to the length of the grating, and $\kappa_{max}$ is the peak value of $\kappa(z)$. The effect of this type of taper is to reduce the out-of-band response by more than a factor of 100 below the envelope of the sidelobes of the uniform grating.

The coupling coefficient can be tapered in accordance with a variety of functions to achieve adequate sidelobe suppression. See P. S. Cross and H. Kogelnik, *Optics Letters*, 1, 43–45 (July, 1977).

Figure 5:
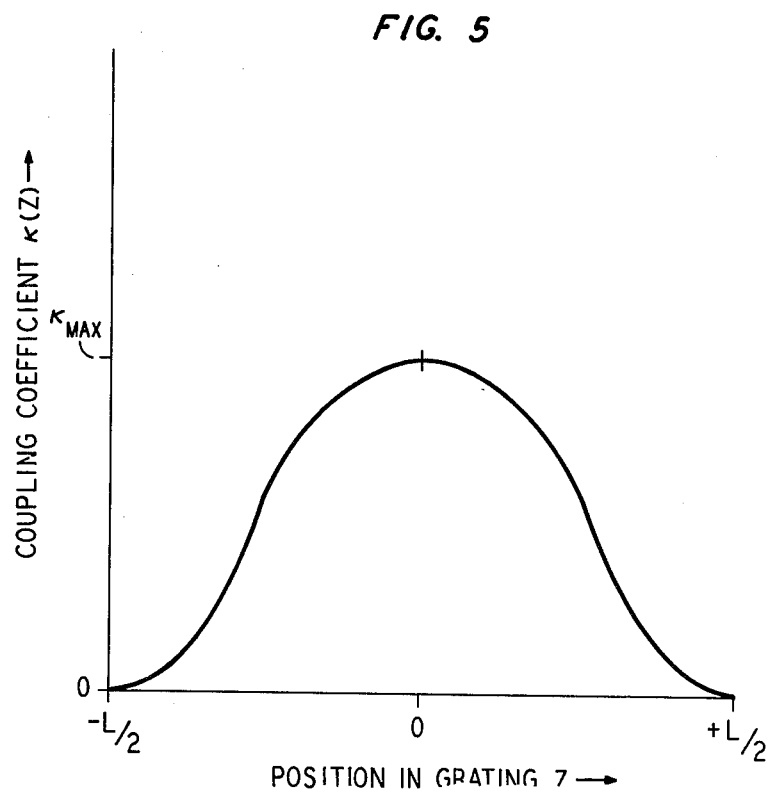
FIG. 5 is a grating taper function useful in describing the operation of the embodiment shown in FIG. 1.

Unfortunately, the perturbations introduced by a grating has an effective shift in the center frequency of the grating. In the case of a uniform grating this shift in center frequency simply causes the entire reflection spectrum to be translated in frequency. In a tapered grating, however, of the type used for gratings 11 and 12, the local center frequency varies with the position in the grating. Hence, there is an inherent chirp in the local center frequency that must be taken into account in a tapered grating. To compensate for this inherent chirp, the spacing between the rows of dots in gratings 11 and 12 in accordance with the following equation:

$$\Lambda(z) = \Lambda_0[1 - \frac{\Lambda_0}{2} \kappa(z)] \quad (2)$$

where $\kappa(z)$ is the coupling coefficient given in equation 1 and shown in FIG. 5, and $\Lambda_O$ is the grating period which would be required in an unchirped grating. Hence, not only is the grating tapered by varying the number of dots per row in accordance with $\kappa_{max}$, but the grating is chirped by varying the spacing between rows in accordance with equation 2.

In summary, the energy coupled out of the second and third ports of directional coupler 13 is selectively reflected by reflection gratings 11 and 12. The spacing of the dots and rows of dots in each of these gratings is such that only the energy that is present in a window symmetrically located about the center frequency of the cascaded grating resonators is reflected back to the multistrip element. Energy at frequencies outside of this window are permitted to pass through the reflection gratings and are subsequently attenuated in absorbers 32 and 33.

Energy at the selected frequencies that are reflected by gratings 11 and 12 is coupled back into the second and third ports of directional coupler 13. By an action that is well known to those skilled in the art, energy present at ports two and three es effectively combined to produce an output at a fourth port of directional coupler 13. This energy at the fourth port is coupled as shown by an unnumbered arrow in FIG. 1 to the input of the cascaded grating resonator filter 16.

The acoustic energy available at the output of cascaded grating resonator filter 16 is coupled into one port of a directional coupler 22 which like coupler 13 is actually constructed as a multistrip element. The energy divided by this multistrip element is coupled to the inputs of reflection gratings 23 and 24 which are identical in construction to reflection gratings 11 and 12. Accordingly, the multistrip element of coupler 22 and reflection gratings 23 and 24 also provide a track-changing element having a frequency characteristic that is identical to the track-changing element at the input of filter 16. These two track-changing elements combine to provide a frequency characteristic of the type illustrated in FIG. 3. As indicated in FIG. 3, the track-changing elements essentially provide a broad band windowing function with little loss in the bandpass region and ever increasing loss as the frequency both increases and decreases from the center frequency of the structure. Absorbers 36 and 37 attenuate any acoustical energy that is not reflected by gratings 23 and 24 respectively.

The energy available from the track-changing element, consisting of coupler 22 and gratings 23 and 24 is coupled to an output transducer 25. Transducer 25 like transducer 14 is associated with an untapered, unchirped grating 26 which is constructed with a pattern of aluminum dots that is identical to the pattern for grating 15. As a result, transducer 25 and reflection grating 26 serve as a unidirectional termination for the energy presented out of directional coupler 22. Absorber 35, like absorber 34, attenuates any acoustic energy that is not reflected by its corresponding grating 26.

Figure 4:
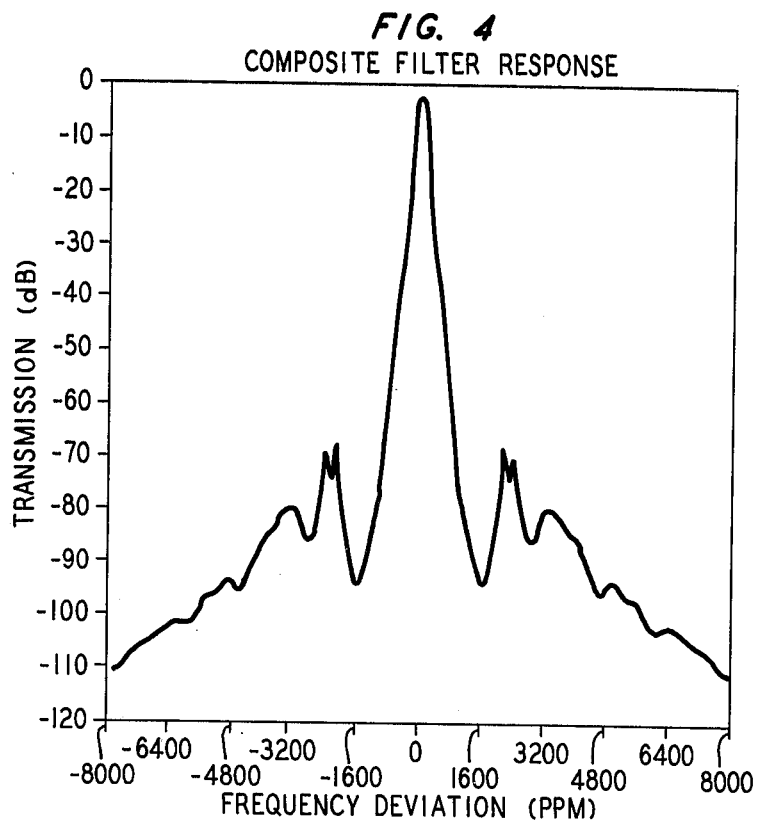

The overall filter characteristic between output terminals 40 and 41 and input terminals 30 and 31 is illustrated in FIG. 4. This filter characteristic is essentially a combination of the characteristic provided by the cascaded grating resonator filter 16 and the characteristic provided by the input and output trackchanging elements. As indicated in FIG. 4, the overall device provides a narrow bandpass characteristic with very little loss in the bandpass region and high loss with very reduced sidelobes in the out-of-band region.

Figure 6:
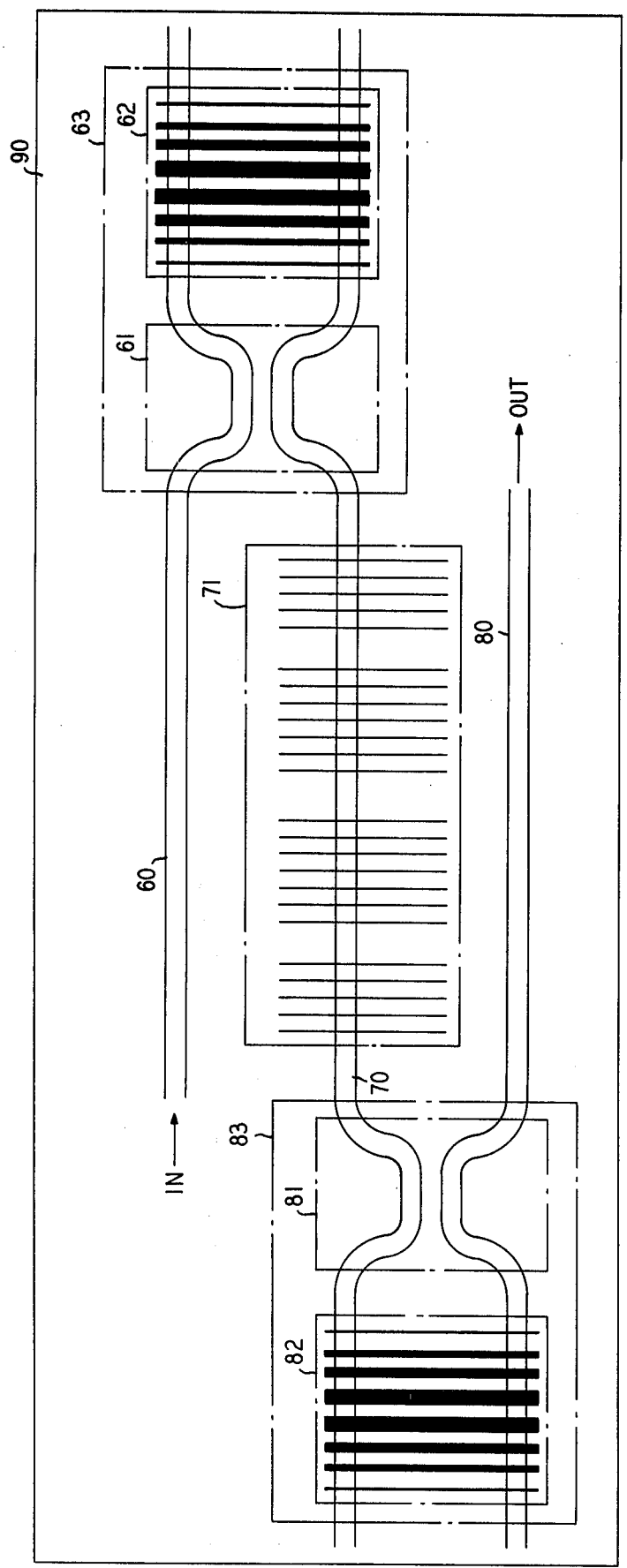
FIG. 6 is an optical filter using cascaded grating resonators and input and output couplers constructed in accordance with the present invention.

The invention is also applicable at optical wavelengths. FIG. 6 is a schematic and pictorial illustration of an optical device that can be utilized to provide a filter characteristic of the type shown in FIG. 4 to a signal traveling in a thin film waveguide. Titanium is diffused into a lithium niobate substrate 90 in patterns corresponding to waveguides 60, 70 and 80 in FIG. 6. No device or means is shown for inserting an optical signal in waveguide 60 or for extracting a waveguide signal from waveguide 80, but these techniques are well known to those skilled in the thin film optical waveguide art. Prisms or gratings made of surface corrugations can be utilized to perform these functions, but it should also be understood that the apparatus illustrated in FIG. 6 may be part of a much larger system, and in that case, waveguide 60 may be energized by some preceding apparatus also constructed on the substrate.

Waveguides 60 and 70 depart from a straight line so as to become proximate to each other in the region identified by the dotted box in 61 in FIG. 6, thereby forming a 3 dB directional coupler. The operation of this coupler and dimensioning necessary to provide 3 dB directional coupling is well known in the art. See for example, the article "Dielectric Rectangular Waveguide and Directional Coupler for Integrated Optics", by E. A. J. Marcatili, *Bell System Technical Journal*, pp. 2103, Sept. 1969. Similarly, waveguide 70 and 80 depart from a straight line in order to become proximate to each other, thereby forming a 3 dB directional coupler 81.

Surface corrugations are established over waveguide 70 between the directional couplers 61 and 81, in order to provide a cascaded grating resonator filter 71 that is the optical analog of the cascaded grating resonator filter 16 in FIG. 1. The grating resonator filter 71 can be manufactured in the surface of the lithium niobate substrate by coating the substrate with a photoresist material, photographically creating a pattern equivalent to the corrugations to be established, developing the photoresist material, and micromachining the developed pattern by using the technique of ion beam micromachining. The quarter wavelength gaps required in the pattern can be established by using the invention disclosed in a copending application by P. S. Cross entitled, "Method and Apparatus for Fabricating Optical Waveguide Grating Resonators", filed May 26, 1977, Ser. No. 800,651.

Finally, surface corrugations are provided in the areas designated as 62 and 82 in FIG. 6 in order to provide tapered and chirped reflection gratings that reflect energy in a selected band of frequencies centered around the center passband frequency of the grating resonator filter 71. These reflection gratings can be chirped by using techniques similar to those disclosed in U.S. Pat. No. 3,578,845 to R. E. Brooks et al issued May 8, 1977. Tapering of the gratings can be accomplished by using ion beam etching techniques well known to those skilled in the acoustic surface wave art. Briefly, the groove in the center of the grating is caused to be the deepest groove, and the depth of each groove is decreased for each groove further removed from the center of the grating.

The operation of the optical apparatus disclosed in FIG. 6 is analogous to the operation of the surface acoustical wave apparatus disclosed in FIG. 1. Light propagating in the strip waveguide 60 toward the directional coupler 61 is selectively coupled into filter 71 by the track-changing element 63, consisting of both directional coupler 61 and grating 62. The light in waveguide 60 is divided equally by coupler 61 so as to propagate in both waveguide 60 and 70 toward grating 62. Only the wavelengths that are reflected by the tapered and chirped grating 62 are caused to reenter directional coupler 61 so as to propagate in waveguide 70 toward the grating resonator filter 71. All other wavelengths continue to propagate beyond grating 62 and are therefore available for processing at any subsequent location. A second track-changing element 83, consisting of the directional coupler 81 and reflection grating 82, is identical in operation to the track-changing element 63 and operates to transfer the optical energy at the output of filter 71 into waveguide 80. Hence, hereagain as the acoustical embodiment of FIG. 1, the track-changing elements 63 and 83 perform a windowing function for the cascaded grating resonator filter thereby providing the necessary out-of-band suppression. As a result, the filtering structure 71 need only be designed to yield the desired passband shape without worrying about out-of-band transmission.

It is to be understood that the above-described embodiments are merely illustrations of embodiments that practice the present invention. Numerous departures may be made by those skilled in the art without departing from the spirit and scope of the present invention. For example, other type substrates such as ST-QUARTZ and lithium tantalate could be used with equal success as a substrate in a surface acoustic wave device. Similarly, other techniques and materials could be utilized to provide any of the resonator grating structures, or directional couplers in the optical and acoustical devices.

What is claimed is:

1. A surface wave device for providing a narrow bandpass characteristic about a center frequency $f_0$ to an input signal, said device comprising a filter having a series of cascaded grating resonators for providing the transmission characteristic proximate to said center frequency $f_0$, and at least one track-changing element for coupling said input signal to said filter, characterized in that said track-changing element includes a four-port directional coupler having a first port positioned to receive said input signal and a fourth port for coupling energy into said filter, at least one periodic chirped and tapered grating having grating elements positioned so as to selectively reflect signal energy from second and third ports of said directional coupler.

2. A surface wave device as defined in claim 1 wherein said input signal is in the form of surface acoustic wave energy and said directional coupler is a multistrip coupling element.

3. A surface wave device as defined in claim 2 wherein said chirped and tapered grating includes rows of metallic dots deposited on said substrate with a variation in the number of dots per row and a variation in the spacing between rows as a function of the distance from said multistrip coupler.

4. A surface wave device as defined in claim 3 wherein said tapered and chirped grating has the maximum number of dots per row at about the middle of said grating.

5. A surface wave device as defined in claim 1 wherein said input signal is in the form of optical energy and said directional coupler is a 3 dB directional coupler comprising two thin film waveguides shaped so as to be proximate to each other for a predetermined distance to establish 3 dB coupling between said waveguides.

6. A surface wave device as defined in claim 5 wherein said waveguide extends beyond one end of said 3 dB coupler, and said chirped and tapered grating comprises surface corrugations as grating elements positioned over the extension of said waveguides, said corrugations being substantially perpendicular to said waveguides.

7. A surface acoustic wave device having elements positioned on the surface of a substrate to process acoustic wave energy propagating in said substrate comprising at least one multistrip coupling element having four ports, a first one of which is positioned to receive an input acoustic signal and present output signals with approximately equal power at second and third ports, first and second tapered and chirped gratings positioned on said substrate so as to selectively reflect the acoustic signals presented by said second and third ports of said multistrip coupler, and a cascaded grating resonator filter positioned on said substrate so as to receive at its input an acoustic signal present at the fourth port of said multistrip coupler.

8. An acoustic surface wave device as defined in claim 7 wherein said first and second chirped and tapered gratings each include a plurality of rows of metallic dots deposited on said substrate with a variation in the number of dots per row and a variation in the spacing between rows as a function of the distance from said multistrip coupler.

9. A surface acoustic wave device as defined in claim 8 wherein the maximum number of dots per row is in the middle of said grating.

10. An optical surface wave device having elements deposited and formed on the surface of a substrate processing an input optical signal comprising at least two thin film waveguides deposited in the surface of said substrate and shaped so as to be proximate to each other in a predetermined region of said substrate thereby establishing 3 dB coupling between said two waveguides, a cascaded grating resonator filter positioned on the surface of said substrate over one of said two waveguides on one side of said 3 dB coupler region, and a tapered and chirped grating having its elements formed on the surface of said substrate over said two waveguides on the opposite side of said 3 dB coupler region.

11. An optical surface wave device as defined in claim 10 wherein said tapered and chirped grating is made of a plurality of surface corrugations in said substrate with the maximum depth corrugation in the middle of said grating.

* * * * *